(12) United States Patent
Tan et al.

(10) Patent No.: US 10,964,849 B2
(45) Date of Patent: Mar. 30, 2021

(54) MICRO LIGHT EMITTING DIODE APPARATUS AND METHOD OF FABRICATING MICRO LIGHT EMITTING DIODE APPARATUS

(71) Applicant: BOE Technology Group Co., Ltd., Beijing (CN)

(72) Inventors: Jifeng Tan, Beijing (CN); Jing Yu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 139 days.

(21) Appl. No.: 16/464,221

(22) PCT Filed: Dec. 18, 2018

(86) PCT No.: PCT/CN2018/121738
§ 371 (c)(1),
(2) Date: May 24, 2019

(87) PCT Pub. No.: WO2019/134500
PCT Pub. Date: Jul. 11, 2019

(65) Prior Publication Data
US 2020/0287093 A1    Sep. 10, 2020

(30) Foreign Application Priority Data
Jan. 8, 2018    (CN) .......................... 201810016133.6

(51) Int. Cl.
*H01L 33/46*    (2010.01)
*H01L 21/683*    (2006.01)
(Continued)

(52) U.S. Cl.
CPC ........ *H01L 33/465* (2013.01); *H01L 21/6835* (2013.01); *H01L 25/0753* (2013.01);
(Continued)

(58) Field of Classification Search
CPC ............... H01L 33/465; H01L 21/6835; H01L 25/0753; H01L 27/1214; H01L 33/06;
(Continued)

(56) References Cited

U.S. PATENT DOCUMENTS

| 5,554,911 A | 9/1996 | Nakayama et al. |
| 7,030,553 B2 * | 4/2006 | Winters ............... H01L 27/3213 313/113 |

(Continued)

FOREIGN PATENT DOCUMENTS

| CN | 1473664 A | 2/2004 |
| CN | 1805161 A | 7/2006 |

(Continued)

OTHER PUBLICATIONS

Second Office Action in the Chinese Patent Application No. 201810016133.6, dated Jul. 14, 2020; English translation attached.

(Continued)

*Primary Examiner* — Vu A Vu
(74) *Attorney, Agent, or Firm* — Intellectual Valley Law, P.C.

(57) ABSTRACT

A micro light emitting diode (micro LED) apparatus. The micro LED apparatus includes a thin film transistor array substrate including a plurality of thin film transistors; an array of a plurality of micro LEDs on the thin film transistor array substrate, a respective one of the plurality of micro LEDs being connected to a respective one of the plurality of thin film transistors; and a plurality of microcavities respectively on a side of the plurality of micro LEDs away from the thin film transistor array substrate. The plurality of microcavities include a first microcavity having a first optical path length and a second microcavity having a second optical path length different from the first optical path length. The first microcavity is configured to allow a light of a first color (Continued)

to transmit there-through. The second microcavity is configured to allow a light of a second color to transmit there-through.

20 Claims, 7 Drawing Sheets

(51) Int. Cl.
| | |
|---|---|
| *H01L 25/075* | (2006.01) |
| *H01L 27/12* | (2006.01) |
| *H01L 33/06* | (2010.01) |
| *H01L 33/32* | (2010.01) |
| *H01L 33/50* | (2010.01) |
| *H01L 33/62* | (2010.01) |

(52) U.S. Cl.
CPC .......... *H01L 27/1214* (2013.01); *H01L 33/06* (2013.01); *H01L 33/32* (2013.01); *H01L 33/502* (2013.01); *H01L 33/62* (2013.01); *H01L 2221/68354* (2013.01); *H01L 2221/68363* (2013.01); *H01L 2933/0025* (2013.01); *H01L 2933/0041* (2013.01); *H01L 2933/0066* (2013.01)

(58) Field of Classification Search
CPC ....... H01L 33/32; H01L 33/502; H01L 33/62; H01L 2221/68354; H01L 2221/68363; H01L 2933/0025; H01L 2933/0041; H01L 2933/0066; H01L 33/504; H01L 33/44; G09F 9/33
USPC .......................................................... 257/89
See application file for complete search history.

(56) References Cited

U.S. PATENT DOCUMENTS

| | | | |
|---|---|---|---|
| 8,207,668 B2* | 6/2012 | Cok | ................. H01L 27/3206 |
| | | | 313/506 |
| 2003/0194497 A1 | 10/2003 | Takada et al. | |
| 2006/0097264 A1 | 5/2006 | Kim et al. | |
| 2009/0085478 A1 | 4/2009 | Cok et al. | |
| 2012/0056164 A1 | 3/2012 | Sumida et al. | |
| 2013/0021556 A1 | 1/2013 | Nagato et al. | |
| 2013/0181194 A1 | 7/2013 | Lee et al. | |
| 2015/0187847 A1 | 7/2015 | Choi | |
| 2016/0011451 A1 | 1/2016 | Shao et al. | |
| 2017/0236866 A1* | 8/2017 | Lee | ..................... H01L 27/153 |
| | | | 257/89 |
| 2017/0236881 A1 | 8/2017 | Shen et al. | |
| 2017/0287882 A1 | 10/2017 | Cok et al. | |

FOREIGN PATENT DOCUMENTS

| | | |
|---|---|---|
| CN | 101821872 A | 9/2010 |
| CN | 102194857 A | 9/2011 |
| CN | 102890359 A | 1/2013 |
| CN | 103777384 A | 5/2014 |
| CN | 103928624 A | 7/2014 |
| CN | 104409468 A | 3/2015 |
| CN | 104752475 A | 7/2015 |
| CN | 106647015 A | 5/2017 |
| CN | 107170901 A | 9/2017 |
| CN | 107195654 A | 9/2017 |
| EP | 1244153 A2 | 9/2002 |

OTHER PUBLICATIONS

International Search Report & Written Opinion dated Mar. 15, 2019, regarding PCT/CN2018/121738.
First Office Action in the Chinese Patent Application No. 201810016133.6, dated Oct. 30, 2019; English translation attached.

* cited by examiner

MICRO LIGHT EMITTING DIODE APPARATUS AND METHOD OF FABRICATING MICRO LIGHT EMITTING DIODE APPARATUS

CROSS-REFERENCE TO RELATED APPLICATION

This application is a national stage application under 35 U.S.C. § 371 of International Application No. PCT/CN2018/121738, filed Dec. 18, 2018, which claims priority to Chinese Patent Application No. 201810016133.6, filed Jan. 8, 2018, the contents of which are incorporated by reference in the entirety.

TECHNICAL FIELD

The present invention relates to display technology, more particularly, to a micro light emitting diode (micro LED) apparatus and fabricating method thereof.

BACKGROUND

In recent years, miniaturized electro-optics devices are proposed and developed, including micro light emitting diode (micro LED). The micro LED-based display panels have the advantages of high brightness, high contrast ratio, fast response, and low power consumption. The micro LED-based display technology has found a wide range of applications in the display field, including smart phones and smart watches.

SUMMARY

In one aspect, the present invention provides a micro light emitting diode (micro LED) apparatus, comprising a thin film transistor array substrate comprising a plurality of thin film transistors; an array of a plurality of micro LEDs on the thin film transistor array substrate, a respective one of the plurality of micro LEDs being connected to a respective one of the plurality of thin film transistors; and a plurality of microcavities respectively on a side of the plurality of micro LEDs away from the thin film transistor array substrate; wherein the plurality of microcavities comprise a first microcavity having a first optical path length and a second microcavity having a second optical path length different from the first optical path length; the first microcavity is configured to allow a light of a first color to transmit there-through; and the second microcavity is configured to allow a light of a second color to transmit there-through, the first color and the second color being two different colors.

Optionally, the plurality of microcavities comprise a first microcavity comprising a first material having a first refractive index and a second microcavity comprising a second material having a second refractive index, the first refractive index different from the second refractive index.

Optionally, thicknesses of the first microcavity and the second microcavity are substantially same.

Optionally, thicknesses of the first microcavity and the second microcavity am different from each other.

Optionally, the first microcavity comprises a first microcavity tuning layer, a second microcavity tuning layer, and a first microcavity layer between the first microcavity tuning layer and the second microcavity tuning layer; and the second microcavity comprises a third microcavity tuning layer, a fourth microcavity tuning layer, and a second microcavity layer between the third microcavity tuning layer and the fourth microcavity tuning layer, wherein optical path lengths of the first microcavity layer and the second microcavity layer are different from each other.

Optionally, refractive indexes of the first microcavity layer and the second microcavity layer are different from each other.

Optionally, thicknesses of the first microcavity layer and the second microcavity layer are different from each other.

Optionally, the first microcavity tuning layer and a second microcavity tuning layer comprise a first microcavity tuning material; the third microcavity tuning layer and the fourth microcavity tuning layer comprise a second microcavity tuning material; and refractive indexes of the first microcavity tuning material and the second microcavity tuning material are different from each other.

Optionally, the first microcavity tuning material comprises silicon; and the second microcavity tuning material comprises a material selected from a group consisting of silver and gold.

Optionally, the first microcavity tuning layer and a second microcavity tuning layer have a first combined thickness; and the third microcavity tuning layer and the fourth microcavity tuning layer have a second combined thickness different from the first combined thickness.

Optionally, a refractive index of the first microcavity layer is approximately 1.5, a thickness of the first microcavity layer is approximately 160 nm, a refractive index of each of the first microcavity tuning layer and the second microcavity tuning layer is approximately 4.0; a refractive index of the second microcavity layer is approximately 1.5, a thickness of the second microcavity layer is approximately 160 nm, a refractive index of each of the third microcavity tuning layer and the fourth microcavity tuning layer is approximately 4.0; a thickness of each of the first microcavity tuning layer and the second microcavity tuning layer is in a range of approximately 10 nm to approximately 30 nm; and a thickness of each of the third microcavity tuning layer and the fourth microcavity tuning layer is in a range of approximately 30 nm to approximately 50 nm.

Optionally, the micro LED apparatus further comprises a phosphor layer between the plurality of micro LEDs and the plurality of microcavities.

Optionally, each of the first microcavity tuning layer, the second microcavity tuning layer, the third microcavity tuning layer, and the fourth microcavity tuning layer has a thickness in a range of approximately 20 nm to approximately 40 nm.

Optionally, the respective one of the plurality of microcavities comprises a microcavity layer having a refractive index in a range of approximately 1.3 to approximately 2.0.

Optionally, the plurality of microcavities comprise three microcavities configured to respectively allow light of three different colors to transmit therethrough; the three microcavities comprise the first microcavity, the second microcavity, and a third microcavity having a third optical path length different from the first optical path length and the second optical path length; and the third microcavity is configured to allow a light of a third color to transmit there-through, the first color, the second color, and the third color being three different colors.

Optionally, the first microcavity comprises a first microcavity tuning layer, a second microcavity tuning layer, and a first microcavity layer between the first microcavity tuning layer and the second microcavity tuning layer; the second microcavity comprises a third microcavity tuning layer, a fourth microcavity tuning layer, and a second microcavity layer between the third microcavity tuning layer and the fourth microcavity tuning layer; the third microcavity comprises a fifth microcavity tuning layer, a sixth microcavity tuning layer, and a third microcavity layer between the fifth microcavity tuning layer and the sixth microcavity tuning layer; a refractive index of the first microcavity layer is approximately 1.4, a thickness of the first microcavity layer is approximately 280 nm, a thickness of each of the first microcavity tuning layer and the second microcavity tuning layer is approximately 20 nm, a refractive index of each of the first microcavity tuning layer and the second microcavity tuning layer is approximately 2.0; a refractive index of the second microcavity layer is approximately 1.4, a thickness of the second microcavity layer is approximately 240 nm, a thickness of each of the third microcavity tuning layer and the fourth microcavity tuning layer is approximately 20 nm, a refractive index of each of the third microcavity tuning layer and the fourth microcavity tuning layer is approximately 2.0; and a refractive index of the third microcavity layer is approximately 1.4, a thickness of the third microcavity layer is approximately 180 nm, a thickness of each of the fifth microcavity tuning layer and the sixth microcavity tuning layer is approximately 20 nm, a refractive index of each of the fifth microcavity tuning layer and the sixth microcavity tuning layer is approximately 2.0.

Optionally, the micro LED apparatus further comprises a mother substrate on a side of the plurality of microcavities away from the plurality of micro LEDs.

In another aspect, the present invention provides a display panel, comprising the micro LED apparatus described herein or fabricated by a method described herein.

In another aspect, the present invention provides a method of fabricating a micro light emitting diode (micro LED) apparatus, comprising forming a plurality of microcavities on a single mother substrate; forming an array of a plurality of micro LEDs on a side of the plurality of microcavities away from the single mother substrate; and transferring the plurality of microcavities and the plurality of micro LEDs from the single mother substrate onto a target substrate; wherein the plurality of microcavities are formed to comprise a first microcavity having a first optical path length and a second microcavity having a second optical path length different from the first optical path length; and the first microcavity is formed to allow a light of a first color to transmit there-through; the second microcavity is formed to allow a light of a second color to transmit there-through, the first color and the second color being two different colors.

Optionally, the first microcavity and a first one of the plurality of micro LEDs constitute a first subpixel of a first color, and the second microcavity and a second one of the plurality of micro LEDs constitute a second subpixel of a second color; and the first subpixel of the first color and the second subpixel of the second color are transferred onto the target substrate in a single step.

Optionally, forming the plurality of microcavities comprises forming a plurality of microcavities having different optical path lengths.

Optionally, forming the plurality of microcavities comprises forming a first microcavity including a first material having a first refractive index, and forming a second microcavity including a second material having a second refractive index, the first refractive index different from the second refractive index.

Optionally, forming the plurality of microcavities comprises forming a first microcavity and forming a second microcavity, the first microcavity and the second microcavity being formed so that thicknesses of the first microcavity and the second microcavity are different from each other.

Optionally, forming the first microcavity includes forming a first microcavity tuning layer, forming a second microcavity tuning layer, and forming a first microcavity layer between the first microcavity tuning layer and the second microcavity tuning layer; forming the second microcavity includes forming a third microcavity tuning layer, forming a fourth microcavity tuning layer, and forming a second microcavity layer between the third microcavity tuning layer and the fourth microcavity tuning layer; and the first microcavity layer and the second microcavity layer are formed so that optical path lengths of the first microcavity layer and the second microcavity layer are different from each other.

Optionally, the first microcavity layer and the second microcavity layer are formed so that refractive indexes of the first microcavity layer and the second microcavity layer are different from each other.

Optionally, the first microcavity layer and the second microcavity layer are formed so that thicknesses of the first microcavity layer and the second microcavity layer are different from each other.

Optionally, the first microcavity tuning layer and a second microcavity tuning layer are formed using a first microcavity tuning material; the third microcavity tuning layer and the fourth microcavity tuning layer are formed using a second microcavity tuning material; and refractive indexes of the first microcavity tuning material and the second microcavity tuning material are different from each other.

Optionally, the first microcavity tuning layer and a second microcavity tuning layer are formed to have a first combined thickness; and the third microcavity tuning layer and the fourth microcavity tuning layer are formed to have a second combined thickness different from the first combined thickness.

Optionally, prior to forming the plurality of micro LEDs, and subsequent to forming the plurality of microcavities, the method further comprises forming a phosphor layer on a side of the plurality of microcavities away from the mother substrate; wherein, subsequent to forming the phosphor layer, the plurality of micro LEDs are formed on a side of the phosphor layer away from the plurality of microcavities.

Optionally, prior to transferring to the plurality of microcavities and the plurality of micro LEDs from the mother substrate onto the target substrate, the method further comprises forming a plurality of anodes and forming a plurality of cathodes on the target substrate, the plurality of anodes respectively corresponding to the plurality of micro LEDs, and the plurality of cathodes respectively corresponding to the plurality of micro LEDs.

Optionally, the method further comprises forming a plurality of first bonding contacts and forming a plurality of second bonding contacts; wherein the plurality of first bonding contacts are formed respectively between the plurality of anodes and the target substrate, and respectively in contact with the plurality of anodes; and the plurality of second bonding contacts are formed respectively between the plurality of cathodes and the target substrate, and respectively in contact with the plurality of cathodes.

Optionally, transferring the plurality of microcavities and the plurality of micro LEDs from the mother substrate onto a target substrate comprises debonding the plurality of microcavities and the plurality of micro LEDs from the mother substrate.

Optionally, subsequent to transferring the plurality of microcavities and the plurality of micro LEDs onto the target substrate, the method further comprises soldering the plurality of micro LEDs respectively onto a plurality of bonding contacts on the target substrate.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
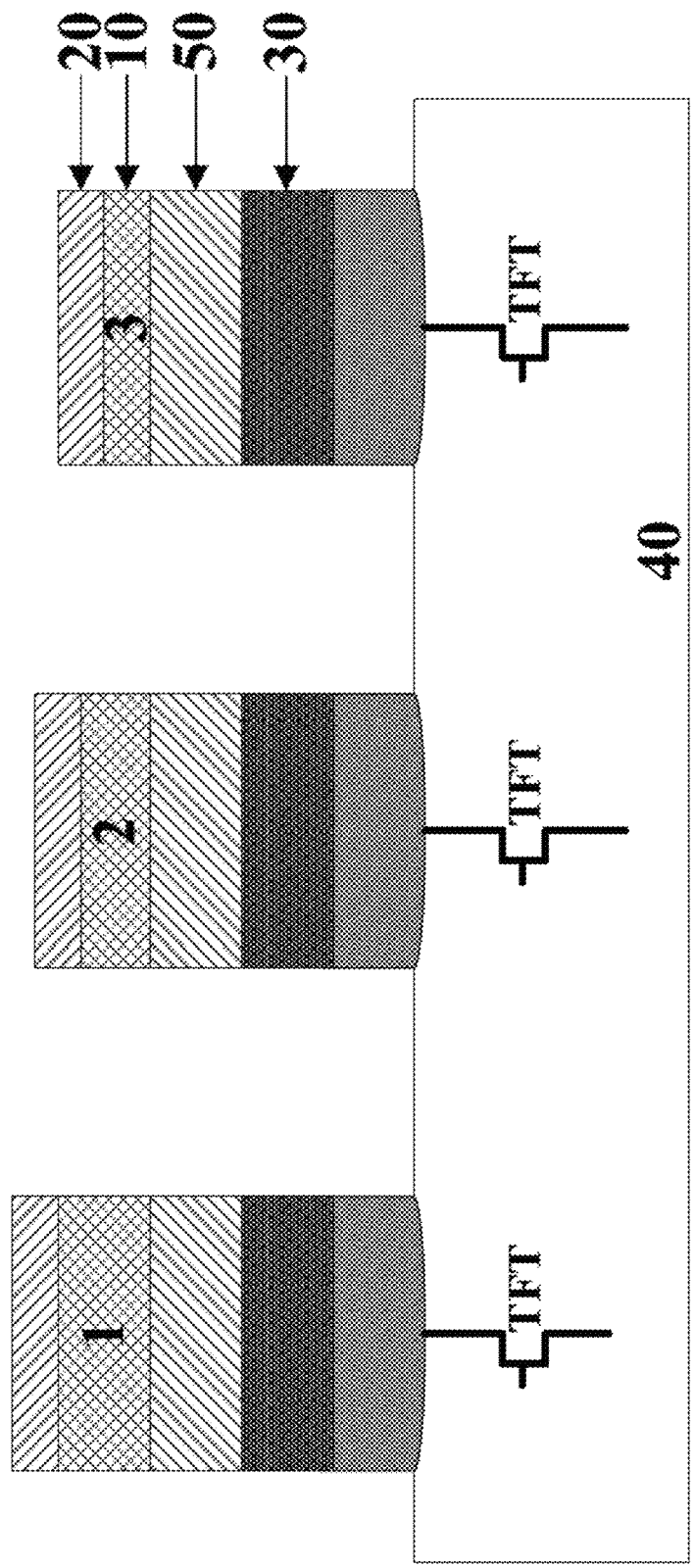
FIG. 1 is a schematic diagram illustrating the structure of a micro LED apparatus in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In a conventional method of fabricating a micro LED apparatus, micro LEDs emitting light of different colors are separately fabricated on different mother substrates. The micro LEDs of different colors are then separately transferred in several separate transferring processes, onto a same target substrate. The conventional method requires multiple rounds of transferring processes, resulting in a relatively low overall alignment accuracy, severely affecting display quality.

Accordingly, the present disclosure provides, inter alia, a micro light emitting diode (micro LED) apparatus and fabricating method thereof that substantially obviate one or more of the problems due to limitations and disadvantages of the related art. In one aspect, the present disclosure provides a micro LED apparatus. In some embodiments, the micro LED apparatus includes a thin film transistor array substrate having a plurality of thin film transistors; an array of a plurality of micro LEDs on the thin film transistor array substrate, a respective one of the plurality of micro LEDs being connected to a respective one of the plurality of thin film transistors; and a plurality of microcavities respectively on a side of the plurality of micro LEDs away from the thin film transistor array substrate. Optionally, the plurality of microcavities include a first microcavity having a first optical path length and a second microcavity having a second optical path length different from the first optical path length. Optionally, the first microcavity is configured to allow a light of a first color to transmit there-through. Optionally, the second microcavity is configured to allow a light of a second color to transmit there-through, the first color and the second color being two different colors.

As used herein, the term "microcavity" refers to a resonant optical cavity in a solid-state light emitting device. For example, in the context of the present disclosure, a microcavity includes two reflective mirrors and a microcavity layer sandwiched there-between. Optionally, the microcavity has an optical distance substantially equal to a sum of optical path lengths of layers between the two reflective mirrors. As used herein, the term "optical path length" refers to a value obtained by multiplying a refractive index n of a medium through which the measurement light travels by a distance the measurement light travels through the medium having the refractive index n, i.e., the optical path length is equal to a distance the measurement light would travel through a vacuum during the time it takes for the measurement light to travel through the medium having the refractive index n.

FIG. 1 is a schematic diagram illustrating the structure of a micro LED apparatus in some embodiments according to the present disclosure. Referring to FIG. 1, the micro LED apparatus in some embodiments includes a thin film transistor array substrate 40 having a plurality of thin film transistors TFT; an array of a plurality of micro LEDs 30 on the thin film transistor array substrate 40, respective one of the plurality of micro LEDs 30 being connected to a respective one of the plurality of thin film transistors 40; and a plurality of microcavities 10 respectively on a side of the plurality of micro LEDs 30 away from the thin film transistor array substrate 40. Optionally, the plurality of microcavities 10 include a first microcavity 1 having a first optical path length and a second microcavity 2 having a second optical path length different from the first optical path length. Optionally, the first microcavity 1 is configured to allow a light of a first color to transmit there-through. Optionally, the second microcavity 2 is configured to allow a light of a second color to transmit there-through, the first color and the second color being two different colors. Optionally, and as shown in FIG. 1, the plurality of microcavities 10 include a first microcavity 1 having a first optical path length, a second microcavity 2 having a second optical path length, and a third microcavity 3 having a third optical path length; the first optical path length, the second optical path length, and the third optical path length being different from each other. Optionally, the first microcavity 1 is configured to allow light of a first color to transmit there-through, the second microcavity 2 is configured to allow light of a second color to transmit there-through, the third microcavity 3 is configured to allow light of a third color to transmit there-through; the first color, the second color, and the third color being three different colors. Optionally, the first color, the second color, and the third color are red, green, and blue.

In some embodiments, the plurality of microcavities 10 include a first microcavity 1 including a first material having a first refractive index and a second microcavity 2 including a second material having a second refractive index, the first refractive index different from the second refractive index. Optionally, the plurality of microcavities 10 include a first microcavity 1 including a first material having a first refractive index, a second microcavity 2 including a second material having a second refractive index, and a third microcavity 3 including a third material having a third refractive index. Optionally, the first refractive index, the second refractive index, and the third refractive index are different from each other.

In some embodiments, thicknesses of the first microcavity 1 and the second microcavity 2 are different from each other. Optionally, thicknesses of the first microcavity 1, the second microcavity 2, and the third microcavity 3 are different from each other.

In some embodiments, each of the plurality of microcavities 10 include a microcavity layer sandwiched by two microcavity tuning layers respectively on two sides of the microcavity layer.

In some embodiments, the plurality of microcavities 10 includes at least two microcavities disposed side by side. Each microcavity includes two microcavity tuning layers and a microcavity layer sandwiched between two microcavity tuning layers. The color of light selectively transmitted through a microcavity is determined by an optical path length of the microcavity. In some embodiments, the color of light selectively transmitted through a microcavity is determined by one or any combination of a thickness of a microcavity layer, a refractive index of a microcavity layer, a thickness of a microcavity tuning layer, and a refractive index of a microcavity tuning layer. Therefore, by adjusting one or a combination of these parameters, monochromatic light of different colors can transmit through the microcavity.

Optionally, to guarantee a high transmittance, the microcavity layer is formed using a transparent material having a refractive index in a range of approximately 1.3 to approximately 2.0, e.g. glass (with a refractive index of 1.5), polymethyl methacrylate (with a refractive index of 1.4) and so on.

Figure 2:
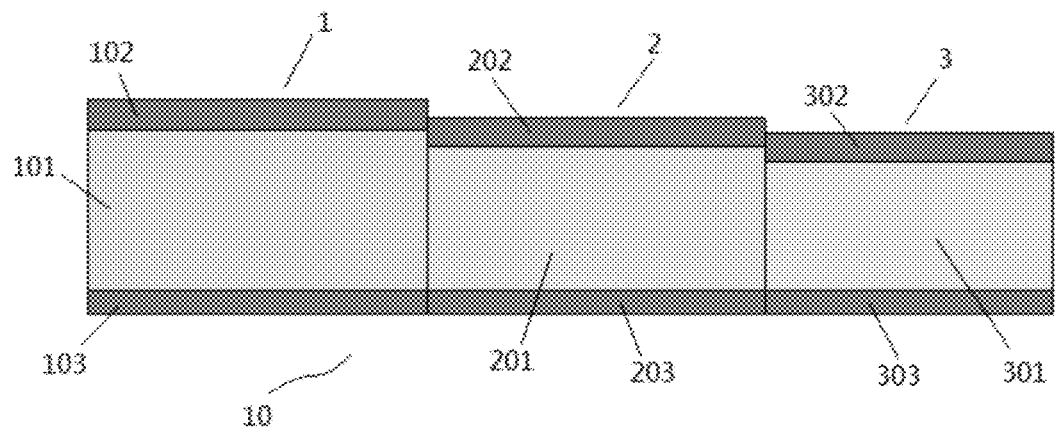
FIG. 2 is a schematic diagram illustrating the structure of a plurality of microcavities in some embodiments according to the present disclosure.

FIG. 2 is a schematic diagram illustrating the structure of a plurality of microcavities in some embodiments according to the present disclosure. Referring to FIG. 2, the plurality of microcavities 10 includes at least a first microcavity 1, a second microcavity 2 and a third microcavity 3. The first microcavity 1, the second microcavity 2 and the third microcavity 3 are disposed side by side. The first microcavity 1 includes a first microcavity layer 101, a first microcavity tuning layer 102 and a second microcavity tuning layer 103. The first microcavity layer 101 is disposed on the second microcavity tuning layer 103, and the first microcavity tuning layer 102 is disposed on a side of the first microcavity layer 101 away from the second microcavity tuning layer 103, e.g., the first microcavity layer 101 is between the first microcavity tuning layer 102 and the second microcavity tuning layer 103. The second microcavity 2 includes a second microcavity layer 201, a third microcavity tuning layer 202 and a fourth microcavity tuning layer 203. The second microcavity layer 201 is disposed on the fourth microcavity tuning layer 203, and the third microcavity tuning layer 202 is disposed on a side of the second microcavity layer 201 away from the fourth microcavity tuning layer 203, e.g., the second microcavity layer 201 is between the third microcavity tuning layer 202 and a fourth microcavity tuning layer 203. The third microcavity 3 includes a third microcavity layer 301, a fifth microcavity tuning layer 302 and a sixth microcavity tuning layer 303. The third microcavity layer 301 is disposed on the sixth microcavity tuning layer 303, and the fifth microcavity tuning layer 302 is disposed on a side of the third microcavity layer 301 away from the sixth microcavity tuning layer 303, e.g., the third microcavity layer 301 is between the fifth microcavity tuning layer 302 and the sixth microcavity tuning layer 303. Optionally, the second microcavity tuning layer 103 is formed prior to forming the first microcavity layer 101, the fourth microcavity tuning layer 203 is formed prior to forming the second microcavity layer 201, and the sixth microcavity tuning layer 303 is formed prior to forming the third microcavity layer 301. Optionally, microcavity tuning layers between adjacent microcavities of the plurality of microcavities 10 are spaced apart from each other, e.g., the second microcavity tuning layer 103 is spaced apart from the fourth microcavity tuning layer 203, and the fourth microcavity tuning layer 203 is spaced apart from the sixth microcavity tuning layer 303. In one example, the first microcavity tuning layer 102 is spaced apart from the third microcavity tuning layer 202, and the third microcavity tuning layer 202 is spaced apart from the fifth microcavity tuning layer 302. Optionally, particularly when the adjacent microcavity tuning layers are formed using a same material (which means the refractive indexes of the adjacent microcavity tuning layers are substantially the same), the adjacent microcavity tuning layers are not spaced apart from each other, e.g., forming an integral structure. In one example, the second microcavity tuning layer 103, the fourth microcavity tuning layer 203, and the sixth microcavity tuning layer 303 constitute an integral structure. Optionally, the first microcavity tuning layer 102, the third microcavity tuning layer 202, and the fifth microcavity tuning layer 302 constitute an integral structure. Optionally, microcavity layers between adjacent microcavities of the plurality of microcavities 10 are spaced apart from each other, e.g., the first microcavity layer 101 is spaced apart from the second microcavity layer 201, and the second microcavity layer 201 is spaced apart from the third microcavity layer 301. Optionally, particularly when the adjacent microcavity layers are formed using a same material (which means the refractive indexes of the adjacent microcavity layers are substantially the same), the adjacent microcavity layers are not spaced apart from each other, e.g., forming an integral structure. In one example, the first microcavity layer 101, the second microcavity layer 201, and the third microcavity layer 301 constitute an integral structure.

In some embodiments, thicknesses of two microcavity tuning layers in a same microcavity of the plurality of microcavities 10 are substantially the same. In some embodiments, thicknesses of two microcavity tuning layers in a same microcavity of the plurality of microcavities 10 are different from each other. Optionally, and referring to FIG. 2, the thickness of the first microcavity tuning layer 102 and the thickness of the second microcavity tuning layer 103 are substantially the same. Optionally, the thickness of the third microcavity tuning layer 202 and the thickness of the fourth microcavity tuning layer 203 are substantially the same. Optionally, the thickness of the fifth microcavity tuning layer 302 and the thickness of the sixth microcavity tuning layer 303 are substantially the same.

In some embodiments, a finite difference time domain modeling method is used for calculating parameters required for achieving a high transmittance rate for light of a specific color (e.g., a monochromatic light). In some embodiments, parameters affecting the light transmittance and color specificity of the microcavity include parameters affecting the optical path length of the microcavity, such as the thickness of a microcavity layer, the refractive index of a microcavity layer, the thickness of a microcavity tuning layer, the refractive index of a microcavity tuning layer, and so on. Optionally, calculating parameters required for achieving a high transmittance rate for light of a specific color includes adjusting one or a combination of the thickness of a microcavity layer, the refractive index of a microcavity layer, the thickness of a microcavity tuning layer and the refractive index of a microcavity tuning layer.

In some embodiments, the microcavity tuning layer (e.g., each of the first microcavity tuning layer 102, the second microcavity tuning layer 103, the third microcavity tuning layer 202, the fourth microcavity tuning layer 203, the fifth microcavity tuning layer 302, and the sixth microcavity tuning layer 303) has a thickness in a range of approximately 20 nm to approximately 40 nm, e.g., approximately 20 nm to approximately 25 nm, approximately 25 nm to approximately 30 nm, approximately 30 nm to approximately 35 nm, and approximately 35 nm to approximately 40 nm. By having a thickness of the microcavity tuning layer in this range, the microcavity tuning layer exhibits a high transmittance rate with unimodal transmission characteristics, and a high color purity with little contamination from light of non-target wavelengths. Optionally, the thickness of the microcavity tuning layer is less than 20 nm, e.g., approximately 5 nm to approximately 10 nm, approximately 10 nm to approximately 15 nm, and approximately 15 nm to approximately 20 rm. Optionally, the thickness of the microcavity tuning layer is greater than 40 run, e.g., approximately 40 nm to approximately 45 nm, approximately 45 nm to approximately 50 nm, approximately 50 nm to approximately 55 nm, and approximately 55 nm to approximately 60 nm.

In some embodiments, the refractive index of the microcavity layer, the refractive indexes of the microcavity tuning layers, the thicknesses of the microcavity tuning layers can remain unchanged, the thickness of the microcavity layer can be adjusted to a specific value to selectively allowed light of a specific color to transmit there-through. Accordingly, by adjusting the thickness of the microcavity layer, the microcavity can be configured to allowed light of different colors to transmit there-through.

Figure 3:
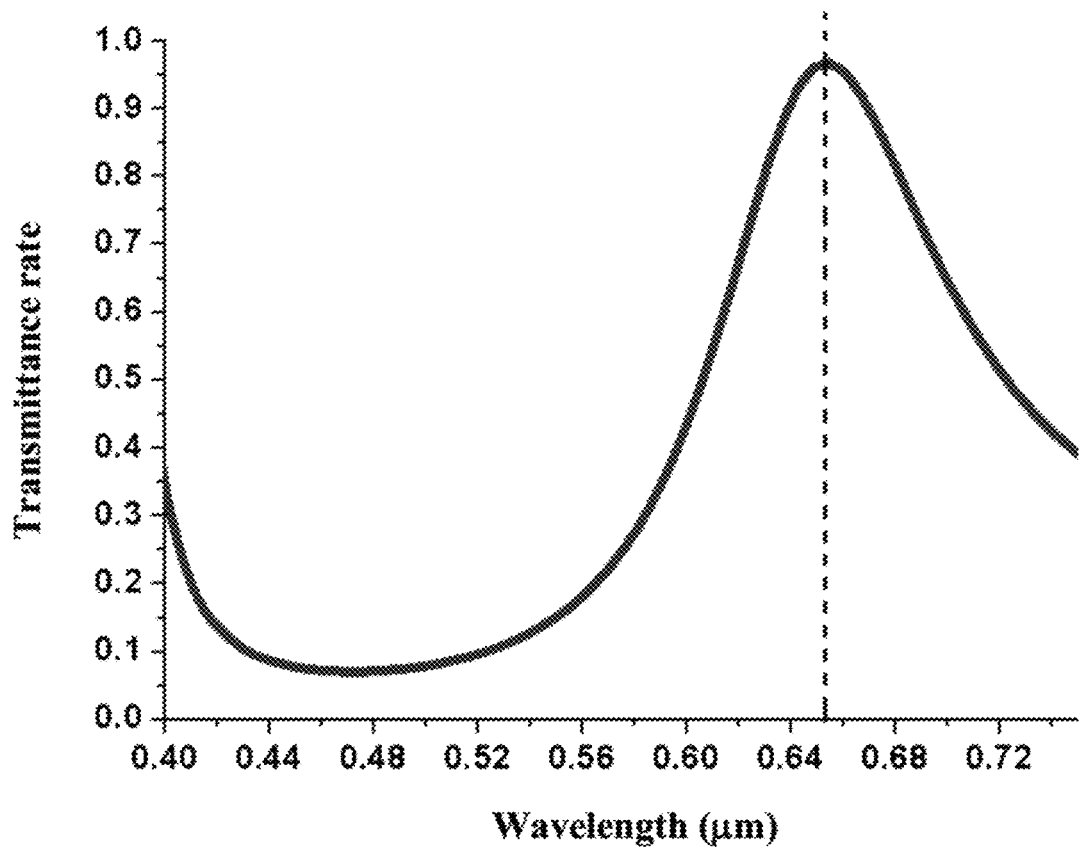
FIG. 3 is a spectrum transmission curve illustrating a red light selectively transmitting through a microcavity in a micro LED apparatus in some embodiments according to the present disclosure.

FIG. 3 is a spectrum transmission curve illustrating a red light selectively transmitting through a microcavity in a micro LED apparatus in some embodiments according to the present disclosure. Referring to both FIG. 2 and FIG. 3, in some embodiments, in the first microcavity 1, the refractive index of the first microcavity layer 101 is 1.4, the thickness of the first microcavity layer 101 is 280 nm, the thickness of each of the first microcavity tuning layer 102 and the second microcavity tuning layer 103 is 20 nm, the refractive index of each of the first microcavity tuning layer 102 and the second microcavity tuning layer 103 is 2.0. Transmittance rates of light spectrum through the first microcavity 1 are shown in FIG. 3. The light in a range of approximately 650 nm±60 nm (e.g. the red light) selectively transmit through the first microcavity 1. In FIG. 3, the full width at half maximum is approximately 120 nm. As shown in FIG. 3, the transmittance rate of the red light reaches the highest value of 97% at a wavelength of approximately 660 nm.

Figure 4:
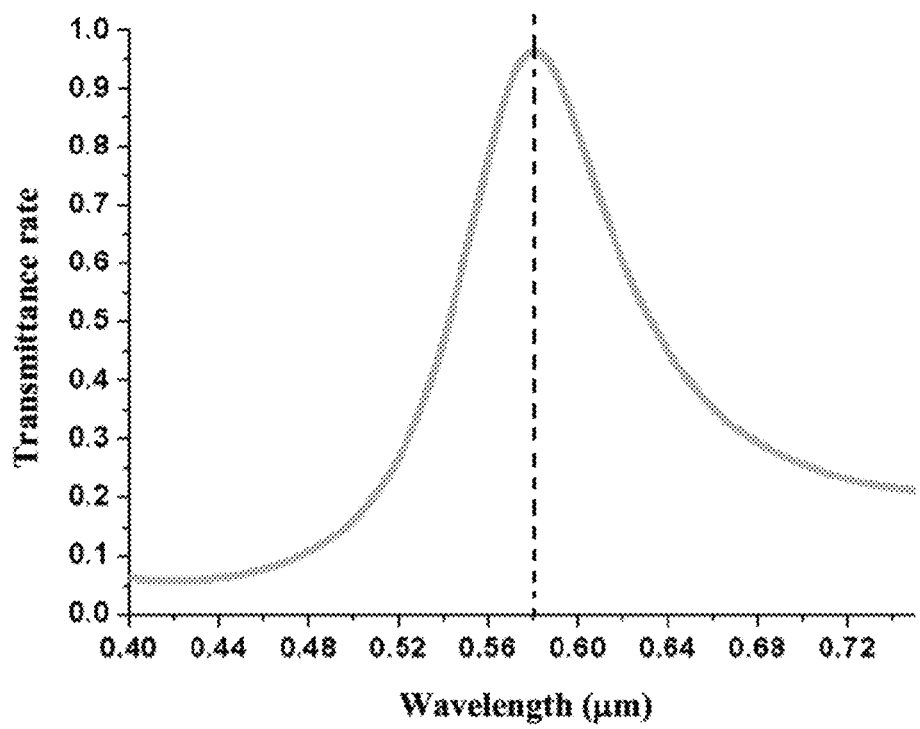
FIG. 4 is a spectrum transmission curve illustrating a green light selectively transmitting through a microcavity in a micro LED apparatus in some embodiments according to the present disclosure.

FIG. 4 is a spectrum transmission curve illustrating a green light selectively transmitting through a microcavity in a micro LED apparatus in some embodiments according to the present disclosure. Referring to both FIG. 2 and FIG. 4, in some embodiments, in the second microcavity 2, the refractive index of the second microcavity layer 201 is 1.4, the thickness of the second microcavity layer 201 is 240 nm, the thickness of each of the third microcavity tuning layer 202 and the fourth microcavity tuning layer 203 is 20 nm, the refractive index of each of the third microcavity tuning layer 202 and the fourth microcavity tuning layer 203 is 2.0. Transmittance rates of light spectrum through the second microcavity 2 are shown in FIG. 4. The light in a range of approximately 580 nm±40 nm (e.g. green light) selectively transmits through the second microcavity 2. In FIG. 4, the full width at half maximum is approximately 80 nm. As shown in FIG. 4, the transmittance rate of the green light reaches the highest value of 96% at a wavelength of approximately 580 nm.

Figure 5:
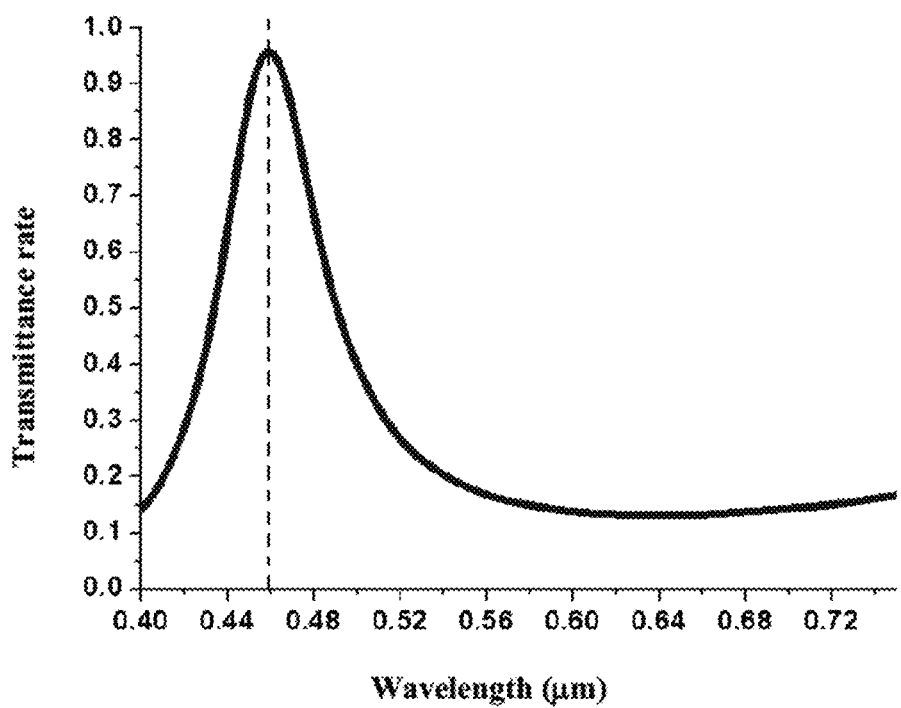
FIG. 5 is a spectrum transmission curve illustrating a blue light selectively transmitting through a microcavity in a micro LED apparatus in some embodiments according to the present disclosure.

FIG. 5 is a spectrum transmission curve illustrating a blue light selectively transmitting through a microcavity in a micro LED apparatus in some embodiments according to the present disclosure. Referring to both FIG. 2 and FIG. 5, in some embodiments, in the third microcavity 3, the refractive index of the third microcavity layer 301 is 1.4, the thickness of the third microcavity layer 301 is 180 nm, the thickness of each of the fifth microcavity tuning layer 302 and the sixth microcavity tuning layer 303 is 20 nm, the refractive index of each of the fifth microcavity tuning layer 302 and the sixth microcavity tuning layer 303 is 2.0. Transmittance rates of light spectrum through the third microcavity 3 are shown in FIG. 5. The light in a range of approximately 450 nm 25 nm (e.g. blue light) selectively transmits through the third microcavity 3. In FIG. 5, the full width at half maximum is approximately 50 nm. As shown in FIG. 5, the transmittance rate of the blue light reaches the highest value of 96% at a wavelength of approximately 460 nm.

In some embodiments, the first microcavity includes a first microcavity layer, the second microcavity includes a second microcavity layer, and optical path lengths of the first microcavity layer and the second microcavity layer are different from each other. Optionally, refractive indexes of the first microcavity layer and the second microcavity layer are different from each other. Optionally, thicknesses of the first microcavity layer and the second microcavity layer are different from each other. Optionally, the thicknesses of the first microcavity layer and the second microcavity layer are substantially the same while the refractive indexes of the first microcavity layer and the second microcavity layer are different from each other, thereby rendering the optical path lengths of the first microcavity layer and the second microcavity layer to be different from each other.

Figure 6:
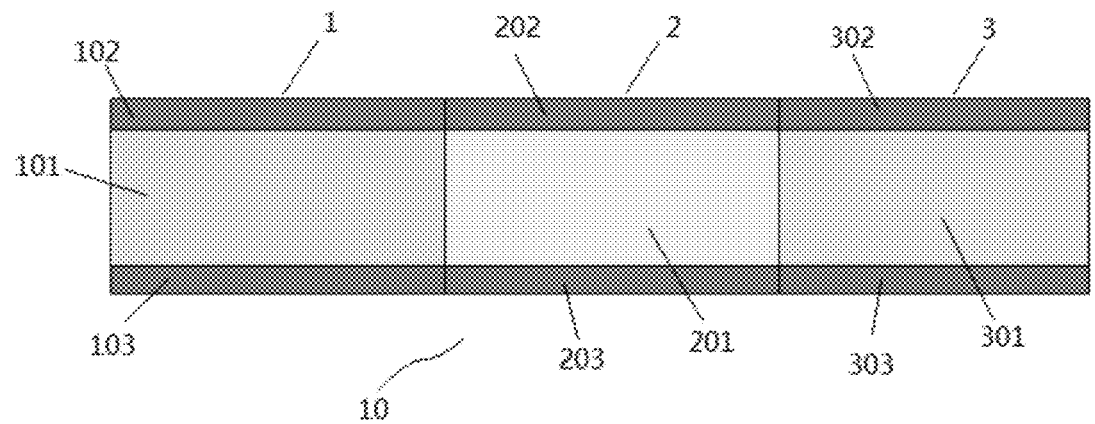
FIG. 6 is a schematic diagram illustrating the structure of a plurality of microcavities in some embodiments according to the present disclosure.

FIG. 6 is a schematic diagram illustrating the structure of a plurality of microcavities in some embodiments according to the present disclosure. Referring to FIG. 6, a first microcavity tuning layer 102, a second microcavity tuning layer 103, a third microcavity tuning layer 202, a fourth microcavity tuning layer 203, a fifth microcavity tuning layer 302, and a sixth microcavity tuning layer 303 have a same thickness and a same refractive index. A first microcavity layer 101, a second microcavity layer 201 and a third microcavity layer 301 have a same thickness but different refractive indexes. Optionally, the first microcavity layer 101, the second microcavity layer 201 and the third microcavity layer 301 are made of different materials. Since the refractive indexes of the first microcavity layer 101, the second microcavity layer 201, and the third microcavity layer 301 are different, different monochromatic light can transmit through different microcavity layers respectively.

In some embodiments, the thickness of the microcavity layer, the thicknesses of the microcavity tuning layers, and the refractive indexes of the microcavity tuning layers can remain unchanged, the refractive index of a microcavity layer can be adjusted to a specific value to selectively allowed light of a specific color to transmit there-through. Accordingly, by adjusting the refractive index of a microcavity layer, the microcavity can be configured to allowed light of different colors to transmit there-through.

Figure 7:
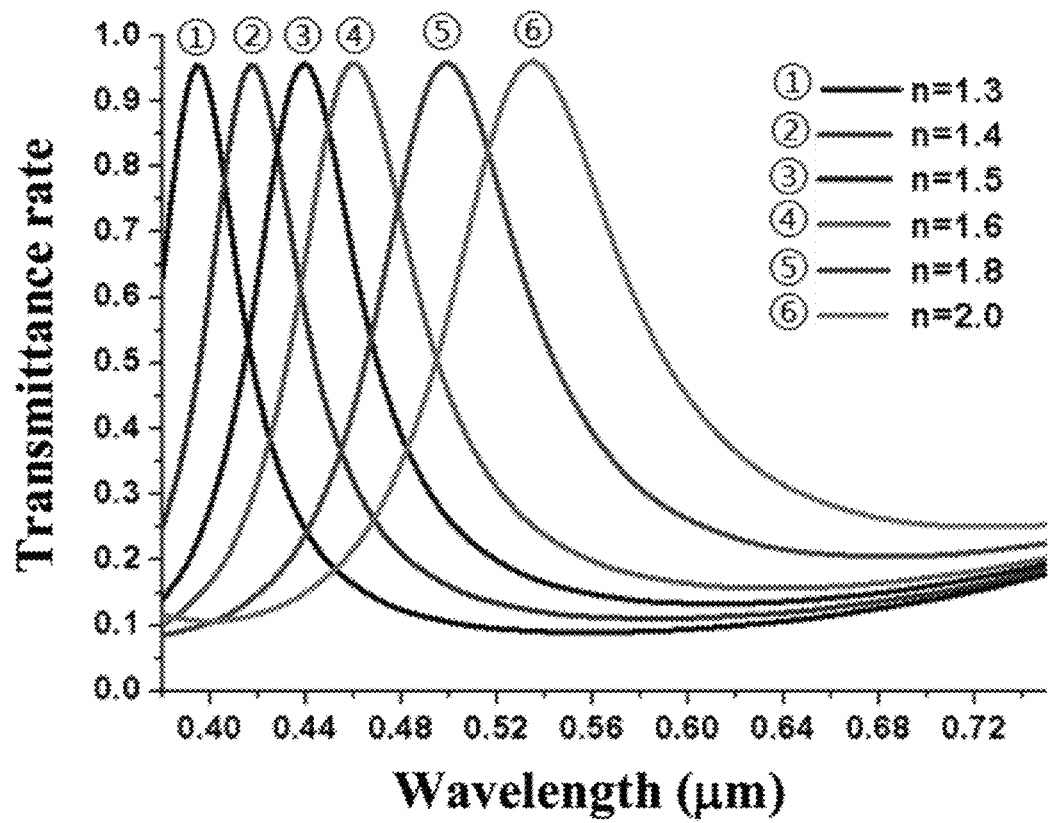
FIG. 7 is spectrum transmission curves of light of various colors selectively transmitting respectively through microcavities having various refractive indexes.

FIG. 7 is spectrum transmission curves of light of various colors selectively transmitting respectively through microcavities having various refractive indexes. Referring to FIG. 7, in some embodiments, in a microcavity, the thickness of a microcavity layer is 160 nm, the thickness of each of the microcavity tuning layers is 20 nm, the refractive index of each of the microcavity tuning layers is 4.0. When the refractive index of the microcavity layer is successively 1.3, 1.4, 1.5, 1.6, 1.8, and 2.0, the monochromatic light with different wavelength can transmit through the microcavity. Referring to FIG. 7, as the refractive index of the microcavity layer increases, the peak wavelength of light transmitting through the microcavity also increases, as well as the full width at half maximum. Referring to FIG. 7, the maximum transmittance rate of light through the microcavity is greater than 95% at various peak wavelengths.

Optionally, when the refractive index of the microcavity layer is 1.3, the transmittance rate of the monochromatic light reaches the maximum value at a wavelength of approximately 400 nm. When the refractive index of the microcavity layer is 1.4, the transmittance rate of the monochromatic light reaches the maximum value at a wavelength of approximately 420 nm. When the refractive index of the microcavity layer is 1.5, the transmittance rate of the monochromatic light reaches the maximum value at a wavelength of approximately 450 nm. When the refractive index of the microcavity layer is 1.6, the transmittance rate of the monochromatic light reaches the maximum value at a wavelength of approximately 470 nm. When the refractive index of the microcavity layer is 1.8, the transmittance rate of the monochromatic light reaches the maximum value at a wavelength of approximately 500 nm. When the refractive index of the microcavity layer is 2.0, the transmittance rate of the monochromatic light reaches the maximum value at a wavelength of approximately 540 nm.

In some embodiments, the thickness of the microcavity layer, the refractive index of a microcavity layer, the thicknesses of the microcavity tuning layers can remain unchanged, the refractive indexes of the microcavity tuning layers can be adjusted to a specific value to selectively allowed light of a specific color to transmit there-through. Accordingly, by adjusting the refractive indexes of the microcavity tuning layers, the microcavity can be configured to allowed light of different colors to transmit there-through.

In some embodiments, in a microcavity, the microcavity tuning layers are made of same material, therefore, the microcavity tuning layers have a same refractive index and a same extinction coefficient. Optionally, the microcavity tuning layers are made of Ag, Au, or other metal. Optionally, the microcavity tuning layers are made of Si or other non-metallic materials with a high refractive index.

Figure 8:
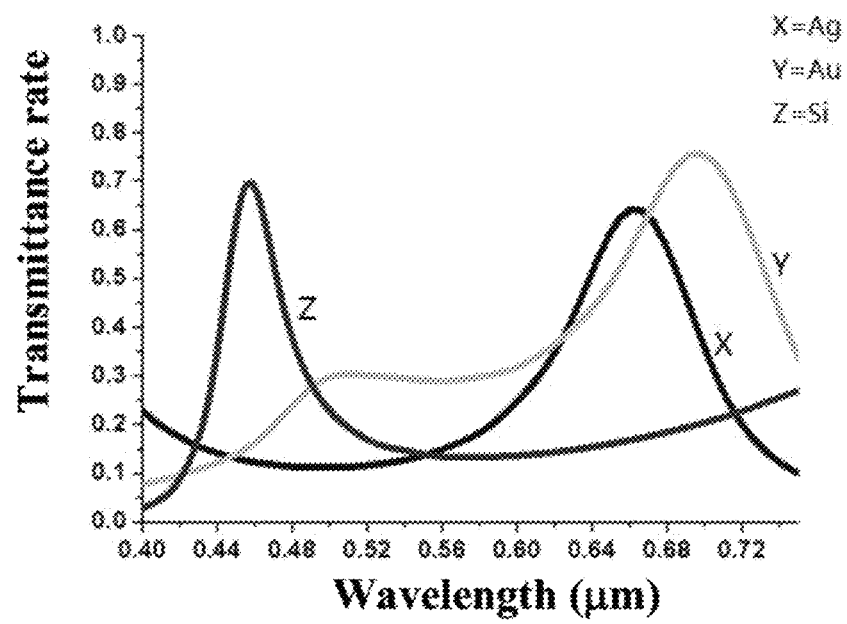
FIG. 8 is spectrum transmission curves of light of various colors selectively transmitting respectively through microcavities having microcavity tuning layers of various refractive indexes.

FIG. 8 is spectrum transmission curves of light of various colors selectively transmitting respectively through microcavities having microcavity tuning layers of various refractive indexes. Referring to FIG. 8, in a microcavity, the thickness of a microcavity layer is 160 nm, the refractive index of the microcavity layer is 1.5, the thickness of each of the microcavity tuning layers is 20 nm. Corresponding to microcavity tuning layers respectively made of different materials, e.g., silver, gold, and silicon, different monochromatic light having a different range of wavelengths can transmit through the microcavities respectively having microcavity tuning layers made of different materials having different refractive indexes. Referring to FIG. 8, a maximum transmittance rate of light through the microcavity is approximately 70% at the peak wavelengths, corresponding to the microcavities respectively having microcavity tuning layers made of different materials (e.g., respectively silver, gold, and silicon).

In one example, the microcavity tuning layers are made of Si, a maximum transmittance rate of light through the microcavity corresponds to a peak wavelength of 460 n (blue light). In another example, the microcavity tuning layers are made of Ag, a maximum transmittance rate of light through the microcavity corresponds to a peak wavelength of 660 nm (red light). In another example, the microcavity tuning layers are made of Au, a maximum transmittance rate of light through the microcavity corresponds to a peak wavelength of 700 nm (red light).

In some embodiments, the thickness of the microcavity layer, the refractive index of a microcavity layer, the refractive indexes of the microcavity tuning layers can remain unchanged, the thicknesses of the microcavity tuning layers can be adjusted to a specific value to selectively allowed light of a specific color to transmit there-through. Accordingly, by adjusting the thicknesses of the microcavity tuning layers, the microcavity can be configured to allowed light of different colors to transmit there-through.

Figure 9:
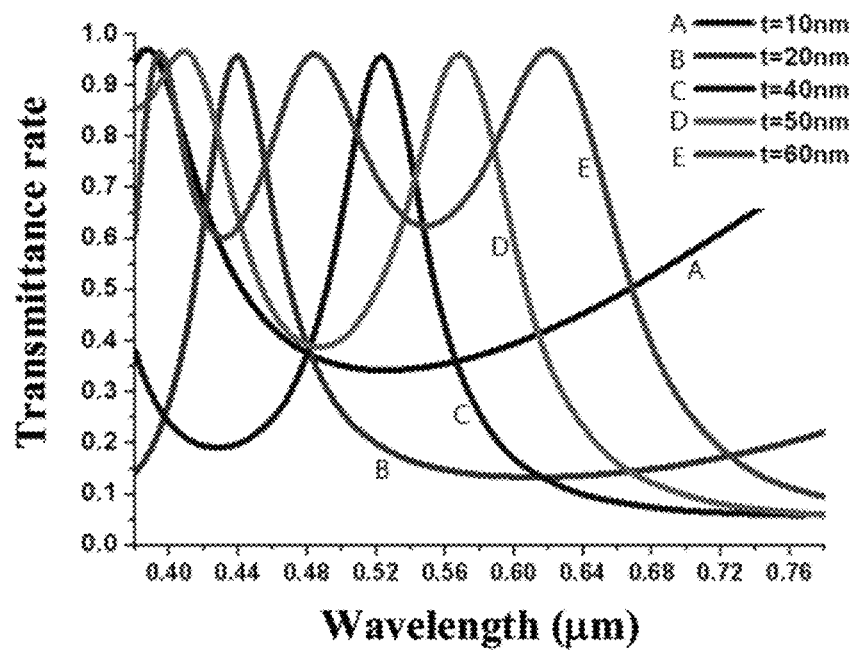
FIG. 9 is spectrum transmission curves of light of various colors selectively transmitting respectively through microcavities having microcavity tuning layers of various thicknesses.

FIG. 9 is spectrum transmission curves of light of various colors selectively transmitting respectively through microcavities having microcavity tuning layers of various thicknesses. Referring to FIG. 9, in a microcavity, the thickness of a microcavity layer is 160 nm, the refractive index of a microcavity layer is 1.5, the refractive index of each of the microcavity tuning layers is 4.0. The thicknesses of each of the microcavity tuning layers are respectively set at approximately 10 nm, approximately 20 nm, approximately 40 nm, approximately 50 nm, and approximately 60 nm. Corresponding to microcavity tuning layers respectively having different thicknesses, different monochromatic light having a different range of wavelengths can transmit through the microcavities respectively having microcavity tuning layers with different thicknesses. Referring to FIG. 9, as the thickness of the microcavity tuning layer increases, the peak wavelength of light transmitting through the microcavity also increases. A maximum transmittance rate of light through the microcavity greater than 95% at the peak wavelengths, corresponding to the microcavities respectively having microcavity tuning layers respectively having different thicknesses. When the thickness of the microcavity tuning layers is 50 nm or 60 nm, light transmitted through the microcavities is not monochromatic. Accordingly, the transmittance rate of red light through the microcavity is below 95%.

Optionally, the thickness of the microcavity tuning layer is in a range of approximately 20±10 nm (e.g., approximately 20±5 nm, approximately 20±3 nm, and approximately 20±1 nm), and the light transmitted through the microcavity is mainly blue light. Optionally, the thickness of the microcavity tuning layer is in a range of 40±10 nm (e.g., approximately 40±5 nm, approximately 40±3 nm, and approximately 40±1 nm), and the light transmitted through the microcavity is mainly green light. Optionally, the thickness of each of the microcavity tuning layers is approximately 10 nm, and a maximum transmittance rate of light through the microcavity corresponds to a peak wavelength of 400 nm. Optionally, the thickness of each of the microcavity tuning layers is approximately 20 nm, and a maximum transmittance rate of light through the microcavity corresponds to a peak wavelength of 450 nm (blue light). Optionally, the thickness of each of the microcavity tuning layers is approximately 40 nm, and a maximum transmittance rate of light through the microcavity corresponds to a peak wavelength of 530 nm (green light). Optionally, the thickness of each of the microcavity tuning layers is approximately 50 nm, and the light transmitted through the microcavity exhibits a bimodal wavelength distribution, with a first peak wavelength of 420 nm and a second peak wavelength of 580 nm, in this case, monochromatic light with a single peak wavelength cannot be obtained. Optionally, the thickness of each of the microcavity tuning layers is approximately 60 nm, and the light transmitted through the microcavity exhibits a trimodal wavelength distribution, with a first peak wavelength of 410 nm, a second peak wavelength of 490 nm, and a third peak wavelength of 620 nm, in this case, monochromatic light with a single peak wavelength cannot be obtained.

Figure 10:
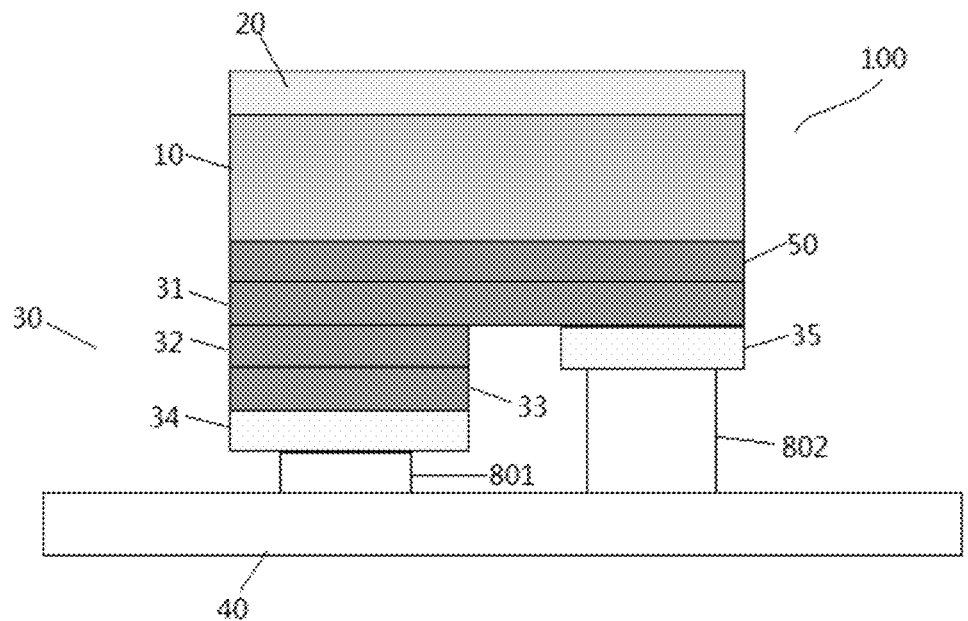
FIG. 10 is a schematic diagram illustrating the structure of a micro LED apparatus in some embodiments according to the present disclosure.

FIG. 10 is a schematic diagram illustrating the structure of a micro LED apparatus in some embodiments according to the present disclosure. In some embodiments, the micro LED apparatus 100 includes at least an array substrate 40, one of the plurality of micro LEDs 30, one of the plurality of microcavities 10, and a mother substrate 20. Optionally, the one of the plurality of micro LEDs 30 is disposed on the array substrate 40, the one of the plurality of microcavities 10 is disposed on a side of the one of the plurality of micro LEDs 30 away from the array substrate 40, the mother substrate 20 is disposed on a side of one of the plurality of microcavities 10 away from the one of the plurality of micro LEDs 30. Examples of the mother substrate 20 include, but are not limited to, a monochrome wafer substrate, GaN, SiC, alumina, sapphire, quartz or monocrystalline silicon. Optionally, in the one of the plurality of microcavities 10, the thickness of a microcavity layer or the refractive index of a microcavity layer, the thickness of the microcavity tuning layers and the refractive index of the microcavity tuning layers can be adjusted, so that monochromatic light of different peak wavelengths can respectively transmit through. As a result, the light emitted from the one of the plurality of micro LEDs 30 can be converted into various monochrome light of different colors subsequent to transmitting through the one of the plurality of microcavities 10.

In some embodiments, the micro LED apparatus 100 includes a plurality of microcavities 10. In one example, the micro LED apparatus 100 includes three microcavities disposed side by side. Optionally, the red monochromatic light, green monochromatic light and blue monochromatic light can transmit through three microcavities. A compound light of various different colors can be formed by mixing the red monochromatic light, green monochromatic light and blue monochromatic light transmitted respectively through the three microcavities.

In some embodiments, the micro LED 100 includes a phosphor layer 50. Optionally, the phosphor layer 50 is sandwiched between the one of the plurality of micro LEDs 30 and the one of the plurality of microcavities 10. The monochromatic light emitted by the one of the plurality of micro LEDs 30 is converted into a white light after transmitting through the phosphor layer 50, increasing light transmittance through the one of the plurality of microcavities 10. In one example, when the one of the plurality of micro LEDs 30 emits blue light, the phosphor layer 50 contains one of yellow phosphor, quantum dots, and a mixture of red phosphor and green phosphor. Accordingly, the phosphor layer 50 is capable of converting the blue light into white light.

In some embodiments, the one of the plurality of micro LEDs 30 includes a n-GaN layer 31, a multiple quantum well 32, and a p-GaN layer 33. The multiple quantum well 32 is disposed on a side of the n-GaN layer 31 away from the phosphor layer 50, and the p-GaN layer 33 is disposed on a side of the multiple quantum well 32 away from the n-GaN layer 31. Optionally, an orthographic projection of the n-GaN layer 31 on the thin film transistor array substrate 40 substantially covers an orthographic projection of the multiple quantum well 32 on the thin film transistor array substrate 40, and covers an orthographic projection of the p-GaN layer 33 on the thin film transistor array substrate 40. An anode 34 is sandwiched between the p-GaN layer 33 and the thin film transistor array substrate 40. A cathode 35 is sandwiched between the n-GaN layer 31 and the thin film transistor array substrate layer 40. The micro LED apparatus 100 in some embodiments further includes a first bonding contact 801 sandwiched between the anode 34 and the thin film transistor array substrate 40 to electrically connect the anode 34 to the thin film transistor array substrate 40. The micro LED apparatus 100 in some embodiments further includes a second bonding contact 802 sandwiched between the cathode 35 and the thin film transistor array substrate 40 to electrically connect the cathode 35 to the thin film transistor array substrate 40.

The multiple quantum well 32 is a core structure of micro LED apparatus 100. In some embodiments, the micro LED apparatus 100 further includes a p-AlGaInP confinement layer and a n-AlGaInp confinement layer. The multiple quantum well 32 is sandwiched between the p-AlGaInP confinement layer and the n-AlGaInp confinement layer. Those two confinement layers have at least two functions, the first function is to confine some charge carriers. The confinement layer contains a high proportion of aluminum, the band gap of the confinement layer is larger than the band gap of the light emitting region. Therefore, the charge carriers injected into the light emitting region are effectively confined in the light emitting layer, increasing the number of composite carriers. Secondly, the confinement layer also functions as a channel. Because the band gap of the confinement layer is relatively wide, the probability that the light emitted from the light emitting region getting absorbed is low. The emitted light can easily transmit through the confinement layer, thereby increasing the quantum efficiency of the micro LED apparatus 100. The key parameters of confinement layer include the proportion of aluminum, the doping concentration, and the thickness of the confinement layer. The higher the proportion of aluminum is, the wider the band gap of the AlGaInP, which in turn exerts a better confinement function on the charge carriers. Adopting a multi-quantum structure in the active layer is associated with many advantages. For example, the active layer having the multi-quantum structure can effectively increase the carrier density, increase the radiation recombination efficiency, require a shorter light emitting region, reduce the self-absorption of photons, as well as produce a quantum size effect which can effectively shift the wavelength of the emitted light toward a shorter side without increasing the proportion of aluminum.

Figure 11:
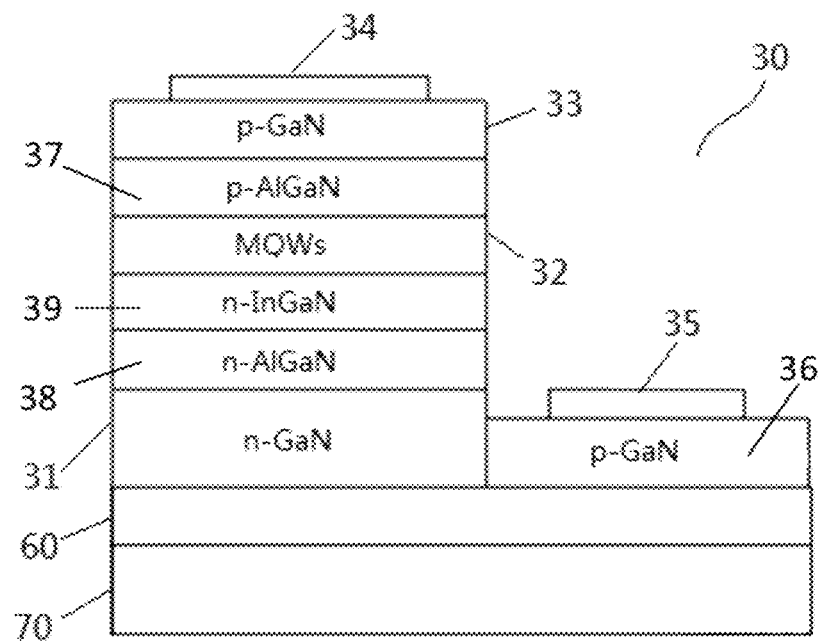
FIG. 11 is a schematic diagram illustrating the structure of a micro LED in some embodiments according to the present disclosure.

FIG. 11 is a schematic diagram illustrating the structure of a micro LED in some embodiments according to the present disclosure. Referring to FIG. 11, the one of the plurality of micro LEDs 30 includes a base substrate 70 and a buffer layer 60 on the base substrate 70, for supporting and protecting the plurality of micro LEDs 30. Referring to FIG. 11, a p-AlGaN layer 37 is sandwiched between a p-GaN layer 33 and a multiple quantum well 32. An n-AlGaN layer 38 is disposed on a side of the n-GaN layer 31 away from the buffer layer 60. An n-InGaN layer 39 is disposed on a side of the n-AlGaN layer 38 away from the n-GaN layer 31. An n-GaN layer 31 is disposed on a side of the buffer layer 60 away from the base substrate 70. A p-GaN layer 36 is disposed on a side of the buffer layer 60 away from the base substrate 70, and the p-GaN layer 36 is adjacent to the n-GaN layer 31. The p-GaN layer 36 and the n-GaN layer 31 are both in contact with the buffer layer 60. The cathode 35 is disposed on a side of the p-GaN layer 36 away from the buffer layer 60. The anode 34 is disposed on a side of the p-GaN layer 33 away from the p-AlGaN layer 37.

Figure 12:
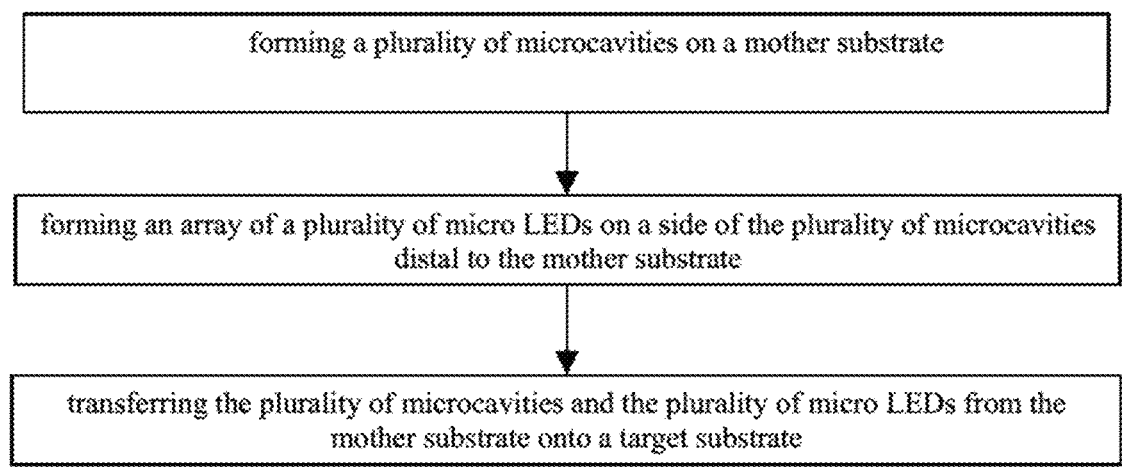
FIG. 12 is a flow chart illustrating a method of fabricating a micro LED apparatus in some embodiments according to the present disclosure.

In another aspect, the present disclosure provides a method of fabricating a micro light emitting diode apparatus. FIG. 12 is a flow chart illustrating a method of fabricating a micro LED apparatus in some embodiments according to the present disclosure. Referring to FIG. 12, the method in some embodiments includes forming a plurality of microcavities on a mother substrate; forming an array of a plurality of micro LEDs on a side of the plurality of microcavities away from the mother substrate; and transferring the plurality of microcavities and the plurality of micro LEDs from the mother substrate onto a target substrate. Optionally, the plurality of microcavities are formed to include a first microcavity having a first optical path length and a second microcavity having a second optical path length different from the first optical path length Optionally, the first microcavity is formed to allow a light of a first color to transmit there-through. Optionally, the second microcavity is formed to allow a light of a second color to transmit there-through, the first color and the second color being two different colors. In the present method, the first microcavity and a first one of the plurality of micro LEDs constitute a first subpixel of a first color, and the second microcavity and a second one of the plurality of micro LEDs constitute a second subpixel of a second color. The first subpixel of the first color and the second subpixel of the second color are transferred onto the target substrate in a single step.

In some embodiments, forming the plurality of microcavities includes forming a plurality of microcavities having different optical path lengths. In some embodiments, forming the plurality of microcavities includes forming a first microcavity including a first material having a first refractive index and a second microcavity including a second material having a second refractive index, the first refractive index different from the second refractive index. In some embodiments, forming the plurality of microcavities includes forming a first microcavity and a second microcavity, the first microcavity and the second microcavity being formed so that thicknesses of the first microcavity and the second microcavity are different from each other.

In some embodiments, forming the first microcavity includes forming a first microcavity tuning layer, forming a second microcavity tuning layer, and forming a first microcavity layer between the first microcavity tuning layer and the second microcavity tuning layer. In some embodiments, forming the second microcavity includes forming a third microcavity tuning layer, forming a fourth microcavity tuning layer, and forming a second microcavity layer between the third microcavity tuning layer and the fourth microcavity tuning layer. Optionally, the first microcavity layer and the second microcavity layer are formed so that optical path lengths of the first microcavity layer and the second microcavity layer are different from each other. Optionally, the first microcavity layer and the second microcavity layer are formed so that refractive indexes of the first microcavity layer and the second microcavity layer are different from each other. Optionally, the first microcavity layer and the second microcavity layer are formed so that thicknesses of the first microcavity layer and the second microcavity layer are different from each other. Optionally, the first microcavity tuning layer and a second microcavity tuning layer are formed using a first microcavity tuning material, the third microcavity tuning layer and the fourth microcavity tuning layer are formed using a second microcavity tuning material, refractive indexes of the first microcavity tuning material and the second microcavity tuning material are different from each other. Optionally, the first microcavity tuning layer and a second microcavity tuning layer are formed to have a first combined thickness, and the third microcavity tuning layer and the fourth microcavity tuning layer are formed to have a second combined thickness different from the first combined thickness. Optionally, each of the first microcavity tuning layer, the second microcavity tuning layer, the third microcavity tuning layer, and the fourth microcavity tuning layer has a thickness in a range of approximately 20 nm to approximately 40 nm, e.g., approximately 20 nm to approximately 25 nm, approximately 25 nm to approximately 30 nm, approximately 30 nm to approximately 35 nm, and approximately 35 nm to approximately 40 nm. Optionally, each of the plurality of microcavities is formed to include a microcavity layer having a refractive index in a range of approximately 1.3 to approximately 2.0. Optionally, the plurality of microcavities are formed to include at least three microcavities configured to respectively allow light of three different colors to transmit therethrough. Optionally, the three different colors are red, green, and blue.

Optionally, subsequent to forming the plurality of micro LEDs on a side of the plurality of microcavities away from the mother substrate, the light emitted from the light emitting layer 30 transmits through plurality of microcavities 10 and become monochromatic light. Optionally, prior to forming the plurality of micro LEDs, and subsequent to forming the plurality of microcavities, the method further includes forming a phosphor layer on a side of the plurality of microcavities away from the mother substrate. Subsequent to forming the phosphor layer, the plurality of micro LEDs are formed on a side of the phosphor layer away from the plurality of microcavities. The light emitted from the plurality of micro LEDs transmit through the phosphor layer and is converted into a white light, which can effectively increase the light transmittance rate.

In some embodiments, the target substrate is a thin film transistor array substrate having a plurality of thin film transistors. Optionally, the method further includes forming a thin film transistor array substrate. Optionally, the method further includes electrically connecting the plurality of micro LEDs respectively to the plurality of thin film transistors.

In some embodiments, prior to transferring to the plurality of microcavities and the plurality of micro LEDs from the mother substrate onto the target substrate (e.g., the thin film transistor array substrate), the method further includes forming a plurality of anodes and a plurality of cathodes on the target substrate, the plurality of anodes respectively corresponding to the plurality of micro LEDs, and the plurality of cathodes respectively corresponding to the plurality of micro LEDs. Optionally, the method further includes forming a plurality of first bonding contacts and forming a plurality of second bonding contacts. The plurality of first bonding contacts are formed respectively between the plurality of anodes and the target substrate, and respectively in contact with the plurality of anodes. The plurality of second bonding contacts are formed respectively between the plurality of cathodes and the target substrate, and respectively in contact with the plurality of cathodes. Subsequent to forming the plurality of anodes and the plurality of cathodes, the plurality of microcavities and the plurality of micro LEDs are transferred from the mother substrate onto the target substrate. Because the plurality of microcavities can transmit red, green and blue light, it is unnecessary to align the mother substrate to the target substrate with a high accuracy, greatly increasing the transfer efficiency.

The micro LED apparatus obviate one or more problems due to limitations and disadvantage of the related art. In the micro LED apparatus according to the present disclosure, the microcavities of the plurality of microcavities are formed to respectively transmit different kinds of monochromatic light. In one example, the plurality of microcavities include three microcavities for transmitting three different kinds of monochromatic light, e.g., a red light, a green light and a blue light, respectively. Subsequent to fabricating the micro LED apparatus on a mother substrate, the micro LED apparatus including the plurality of microcavities configured to transmit light of different colors (e.g., function as a color filter) can be directly transferred to a target substrate includes a thin film transistor array substrate. Accordingly, a full-color display panel can be formed in one step. The micro LED apparatus and the fabricating method according to the present disclosure obviate the requirement of separately transferring micro LEDs of different colors in separate transferring steps, greatly enhancing the transfer efficiency and reducing the alignment errors associated with the multiple-step transferring process.

As compared to a conventional method where micro LEDs emitting light of different colors must be separately fabricated on different mother substrates, and then separately transferred in several separate transferring processes onto a same target substrate, the present method enables a mass transfer of a plurality of subpixels of different colors fabricated in a single mother substrate to be transferred in a single step onto a target substrate.

In some embodiments, the step of transferring the plurality of microcavities and the plurality of micro LEDs from the mother substrate onto a target substrate includes debonding the plurality of microcavities and the plurality of micro LEDs from the mother substrate (e.g., a single mother substrate). Various appropriate debonding methods may be used for debonding the plurality of microcavities and the plurality of micro LEDs from the mother substrate. In some embodiments, a laser lift-off process can be performed to separate the plurality of microcavities and the plurality of micro LEDs from the mother substrate. The laser lift-off process uses a collimated high-energy UV laser beam (e.g., 266 nm). Optionally, the laser lift-off process is an excimer laser lift-off process. In some embodiments, a chemical lift-off process can be performed to separate the plurality of microcavities and the plurality of micro LEDs from the mother substrate. In some embodiments, a mechanical lift-off process can be performed to separate the plurality of microcavities and the plurality of micro LEDs from the mother substrate. In some embodiments, the step of debonding the plurality of microcavities and the plurality of micro LEDs from the mother substrate includes one or a combination of a laser lift-off process, a chemical lift-off process, and a mechanical lift-off process. Optionally, the plurality of microcavities and the plurality of micro LEDs are then immersed in a bath (e.g., an acetone bath) to further separate the plurality of microcavities and the plurality of micro LEDs from the mother substrate.

In some embodiments, subsequent to transferring the plurality of microcavities and the plurality of micro LEDs onto the target substrate, the method further includes soldering the plurality of micro LEDs respectively onto a plurality of bonding contacts on the target substrate. Optionally, the step of soldering the plurality of micro LEDs respectively onto the plurality of bonding contacts is performed by reflow soldering. Optionally, the step of soldering the plurality of micro LEDs respectively onto the plurality of bonding contacts is performed by laser-assisted soldering in which laser radiation is absorbed by the plurality of bonding contacts thereby soldering the plurality of micro LEDs respectively onto the plurality of bonding contacts. Optionally, the step of soldering the plurality of micro LEDs respectively onto the plurality of bonding contacts is performed by laser welding. Optionally, the step of soldering the plurality of micro LEDs respectively onto the plurality of bonding contacts is performed by infrared soldering.

In some embodiments, the mother substrate is a growth substrate, and the plurality of micro LEDs 11 are directly transferred to a target substrate to form an array substrate having the plurality of micro LEDs and the plurality of microcavities.

In some embodiments, the mother substrate is a carrier substrate, e.g., a flexible carrier substrate. Accordingly, prior to transferring the plurality of microcavities and the plurality of micro LEDs from the mother substrate to the target substrate, the method in some embodiments further includes fabricating the plurality of microcavities and the plurality of micro LEDs on a growth substrate; and transferring the plurality of microcavities and the plurality of micro LEDs in the growth substrate onto the mother substrate (e.g., the carrier substrate).

In another aspect, the present disclosure provides a display apparatus having the micro LED apparatus described herein or fabricated by a method described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A micro light emitting diode (micro LED) apparatus, comprising:
   a thin film transistor array substrate comprising a plurality of thin film transistors;
   an array of a plurality of micro LEDs on the thin film transistor array substrate, a respective one of the plurality of micro LEDs being connected to a respective one of the plurality of thin film transistors; and
   a plurality microcavities respectively on a side of the plurality of micro LEDs away from the thin film transistor array substrate;
   wherein the plurality microcavities comprise a first microcavity having a first optical path length and a second microcavity having a second optical path length different from the first optical path length;
   the first microcavity is configured to allow a light of a first color to transmit there-through;
   the second microcavity is configured to allow a light of a second color to transmit there-through, the first color and the second color being two different colors;
   the first microcavity comprises a first microcavity tuning layer, a second microcavity tuning layer, and a first microcavity layer between the first microcavity tuning layer and the second microcavity tuning layer;
   the second microcavity comprises a third microcavity tuning layer, a fourth microcavity tuning layer, and a second microcavity layer between the third microcavity tuning layer and the fourth microcavity tuning layer;
   wherein optical path lengths of the first microcavity layer and the second microcavity layer are different from each other; and
   each of the first microcavity tuning layer, the second microcavity tuning layer, the third microcavity tuning layer, and the fourth microcavity tuning layer has a thickness in a range of approximately 20 nm to approximately 40 nm.

2. The micro LED apparatus of claim 1, wherein the plurality microcavities comprise a first microcavity comprising a first material having a first refractive index and a second microcavity comprising a second material having a second refractive index, the first refractive index different from the second refractive index.

3. The micro LED apparatus of claim 2, wherein thicknesses of the first microcavity and the second microcavity are substantially same.

4. The micro LED apparatus of claim 1, wherein thicknesses of the first microcavity and the second microcavity are different from each other.

5. The micro LED apparatus of claim 1, wherein refractive indexes of the first microcavity layer and the second microcavity layer are different from each other.

6. The micro LED apparatus of claim 1, wherein thicknesses of the first microcavity layer and the second microcavity layer are different from each other.

7. The micro LED apparatus of claim 1, wherein the first microcavity tuning layer and a second microcavity tuning layer have a first combined thickness; and
   the third microcavity tuning layer and the fourth microcavity tuning layer have a second combined thickness different from the first combined thickness.

8. The micro LED apparatus of claim 7, wherein a refractive index of the first microcavity layer is approximately 1.5, a thickness of the first microcavity layer is approximately 160 nm, a refractive index of each of the first microcavity tuning layer and the second microcavity tuning layer is approximately 4.0;
   a refractive index of the second microcavity layer is approximately 1.5, a thickness of the second microcavity layer is approximately 160 nm, a refractive index of each of the third microcavity tuning layer and the fourth microcavity tuning layer is approximately 4.0.

9. The micro LED apparatus of claim 1, further comprising a phosphor layer between the plurality of micro LEDs and the plurality microcavities.

10. The micro LED apparatus of claim 1, wherein a respective one of the plurality microcavities comprises a microcavity layer having a refractive index in a range of approximately 1.3 to approximately 2.0.

11. The micro LED apparatus of claim 1, wherein the plurality microcavities comprise three microcavities configured to respectively allow light of three different colors to transmit therethrough;
    the three microcavities comprise the first microcavity, the second microcavity, and a third microcavity having a third optical path length different from the first optical path length and the second optical path length; and
    the third microcavity is configured to allow a light of a third color to transmit there-through, the first color, the second color, and the third color being three different colors.

12. The micro LED apparatus of claim 11, wherein the first microcavity comprises a first microcavity tuning layer, a second microcavity tuning layer, and a first microcavity layer between the first microcavity tuning layer and the second microcavity tuning layer;
    the second microcavity comprises a third microcavity tuning layer, a fourth microcavity tuning layer, and a second microcavity layer between the third microcavity tuning layer and the fourth microcavity tuning layer;
    the third microcavity comprises a fifth microcavity tuning layer, a sixth microcavity tuning layer, and a third microcavity layer between the fifth microcavity tuning layer and the sixth microcavity tuning layer;
    a refractive index of the first microcavity layer is approximately 1.4, a thickness of the first microcavity layer is approximately 280 nm, a refractive index of each of the first microcavity tuning layer and the second microcavity tuning layer is approximately 2.0;
    a refractive index of the second microcavity layer is approximately 1.4, a thickness of the second microcavity layer is approximately 240 nm, a refractive index of each of the third microcavity tuning layer and the fourth microcavity tuning layer is approximately 2.0; and
    a refractive index of the third microcavity layer is approximately 1.4, a thickness of the third microcavity layer is approximately 180 nm, a refractive index of each of the fifth microcavity tuning layer and the sixth microcavity tuning layer is approximately 2.0.

13. The micro LED apparatus of claim 1, further comprising a mother substrate on a side of the plurality microcavities away from the plurality of micro LEDs.

14. A display panel, comprising the micro LED apparatus of claim 1.

15. A micro light emitting diode (micro LED) apparatus, comprising:
a thin film transistor array substrate comprising a plurality of thin film transistors;
an array of a plurality of micro LEDs on the thin film transistor array substrate, a respective one of the plurality of micro LEDs being connected to a respective one of the plurality of thin film transistors; and
a plurality microcavities respectively on a side of the plurality of micro LEDs away from the thin film transistor array substrate;
wherein the plurality microcavities comprise a first microcavity having a first optical path length and a second microcavity having a second optical path length different from the first optical path length;
the first microcavity is configured to allow a light of a first color to transmit there-through;
the second microcavity is configured to allow a light of a second color to transmit there-through, the first color and the second color being two different colors;
the first microcavity comprises a first microcavity tuning layer, a second microcavity tuning layer, and a first microcavity layer between the first microcavity tuning layer and the second microcavity tuning layer;
the second microcavity comprises a third microcavity tuning layer, a fourth microcavity tuning layer, and a second microcavity layer between the third microcavity tuning layer and the fourth microcavity tuning layer;
wherein optical path lengths of the first microcavity layer and the second microcavity layer are different from each other;
wherein the first microcavity tuning layer and a second microcavity tuning layer comprise a first microcavity tuning material;
the third microcavity tuning layer and the fourth microcavity tuning layer comprise a second microcavity tuning material; and
refractive indexes of the first microcavity tuning material and the second microcavity tuning material are different from each other.

16. The micro LED apparatus of claim 15, wherein the first microcavity tuning material comprises silicon; and
the second microcavity tuning material comprises a material selected from a group consisting of silver and gold.

17. A method of fabricating a micro light emitting diode (micro LED) apparatus, comprising:
forming a plurality microcavities on a single mother substrate;
forming an array of a plurality of micro LEDs on a side of the plurality microcavities away from the single mother substrate; and
transferring the plurality microcavities and the plurality of micro LEDs from the single mother substrate onto a target substrate;
wherein the plurality microcavities are formed to comprise a first microcavity having a first optical path length and a second microcavity having a second optical path length different from the first optical path length; and
the first microcavity is formed to allow a light of a first color to transmit there-through;
the second microcavity is formed to allow a light of a second color to transmit there-through, the first color and the second color being two different colors.

18. The method of claim 17, wherein the first microcavity and a first one of the plurality of micro LEDs constitute a first subpixel of a first color, and the second microcavity and a second one of the plurality of micro LEDs constitute a second subpixel of a second color; and
the first subpixel of the first color and the second subpixel of the second color are transferred onto the target substrate in a single step.

19. The method of claim 17, wherein forming the plurality of microcavities comprises forming a first microcavity including a first material having a first refractive index, and forming a second microcavity including a second material having a second refractive index, the first refractive index different from the second refractive index.

20. The method of claim 17, wherein forming the plurality of microcavities comprises forming a first microcavity and forming a second microcavity, the first microcavity and the second microcavity being formed so that thicknesses of the first microcavity and the second microcavity are different from each other.

* * * * *